(12) United States Patent　(10) Patent No.:　US 6,693,460 B2
Kanba　(45) Date of Patent:　Feb. 17, 2004

(54) SCAN FLIP-FLOP AND SEMICONDUCTOR INTEGRATED CIRCUIT DEVICE

(75) Inventor: Koji Kanba, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/234,612

(22) Filed: Sep. 4, 2002

(65) Prior Publication Data

US 2003/0066002 A1 Apr. 3, 2003

(30) Foreign Application Priority Data

Sep. 5, 2001　(JP) ........................................ 2001-268916
Dec. 20, 2001　(JP) ........................................ 2001-387781

(51) Int. Cl.[7] ......................... H03K 19/00; H03K 3/289
(52) U.S. Cl. ............................. 326/93; 326/16; 327/202
(58) Field of Search ............................. 326/93, 95, 96, 326/16; 327/202, 203, 212, 213, 225; 714/726, 731

(56) References Cited

U.S. PATENT DOCUMENTS 5,463,338 A * 10/1995 Yurash ........................ 327/202
5,633,606 A * 5/1997 Gaudet et al. ............... 327/202
5,646,567 A * 7/1997 Felix ........................... 327/202

FOREIGN PATENT DOCUMENTS

JP　01013482 A * 1/1989 ........... G01R/31/28

* cited by examiner

Primary Examiner—James H. Cho
(74) Attorney, Agent, or Firm—Darryl G. Walker; Bradley T. Sako

(57) ABSTRACT

A scan flip-flop (100A) that may operate as a positive flip-flop or a negative flip-flop in a normal operating mode has been disclosed. Scan flip-flop (100A) may include a master latching circuit (11), a slave latching circuit (12), and a clock circuit (13A). Clock circuit (13A) may receive a signal (XA), a control signal (control), and a mode signal (SCN). Signal (XA) may select between a positive flip-flop operation and a negative flip-flop operation when in a normal operating mode. Mode signal (SCN) may select between a normal operating mode and a scan test mode. Control signal (control) may disable signal (XA) so that scan flip-flop (100A) may operate in a known mode, such as a positive flip-flop, regardless as to the value of signal (XA). Scan flip-flop (100A) may reduce logic gates in clock lines which may be required in a conventional approach.

20 Claims, 8 Drawing Sheets

SCAN FLIP-FLOP AND SEMICONDUCTOR INTEGRATED CIRCUIT DEVICE

TECHNICAL FIELD

The present invention relates generally to a semiconductor integrated circuit device including a scan flip-flop and more particularly to a semiconductor integrated circuit device including a scan flip flop to be used in testing the semiconductor integrated circuit device.

BACKGROUND OF THE INVENTION

It has become difficult to test recent semiconductor integrated circuit devices (hereinafter referred to as "LSI's") due to such LSI's having high integration and an increased number of input terminals. A technique for achieving testability of an LSI is by implementing a scan path method. A scan path method includes designing flip-flop circuits (scan flip-flops) that operate as shift registers. In this way, values stored in a scan flip-flop can be arbitrarily controlled and sampled by, for example, a tester at predetermined times by utilizing a shifting function.

To test an LSI by using a scan path method, the LSI is internally provided with a plurality of scan flip-flops. The scan flip-flops act as flip-flops and are used in a normal operation and in a scan test operation of the LSI. The input and output terminals of the scan flip-flops are serially connected (i.e., concatenated) to form a shift register circuit.

Each scan flip-flop is a circuit including a scan test operation function and a normal operation function. In a scan test operation function, the scan flip-flip acts as a flip-flop based on a data input from a scan-in signal SIN providing a test pattern signal to be latched based on a scan clock SC used as a test clock. In a normal operation function, a scan flip-flop acts as a normal flip-flop.

Scan flip-flops can be edge triggered. Scan flip-flops that operate off a rising clock edge are called a "positive F/F (flip-flop)" and scan flip-flops that operate off a falling clock edge are called a "negative F/F (flip-flop)".

FIG. 4 is a circuit schematic diagram of a conventional scan flip-flop given the general reference character 400. Conventional scan flip-flop 400 is a positive F/F and is hereinafter referred to as a conventional positive scan F/F 400.

Referring now to FIG. 4, conventional positive scan flip-flop 400 includes a first master latching circuit 1, a second master latching circuit 2, a slave latching circuit 3, and a clock circuit 4. First master latching circuit 1 is used in a normal operation. Second master latching circuit 2 is used in a scan test operation. Slave latching circuit 3 is commonly used in the normal operation and the scan test operation. Clock circuit 4 generates signals for controlling the first master latching circuit 1, second master latching circuit 2, and the slave latching circuit 3 in accordance with a normal operation clock CLK, a first scan clock SC1, and a second scan clock SC2.

Clock circuit 4 includes inverters (IV41 to IV46). Inverter INV41 receives normal operation clock CLK as an input and provides an inverted normal operation clock at terminal AB. Inverter INV42 has an input connected to terminal AB and provides a normal operation clock at terminal A. Inverter INV43 receives first scan clock SC1 as an input and provides an inverted first scan clock at terminal S1B. Inverter INV44 has an input connected to terminal S2B and provides a first scan clock at terminal S1. Inverter INV45 receives second scan clock SC2 as an input and provides an inverted second scan clock at terminal S2B. Inverter INV46 has an input connected to terminal S2B and provides a second scan clock at terminal S2.

First master latching circuit 1 includes transfer gates (TG11 to TG13) and inverters (INV11 and INV12). Transfer gate TG11 is connected between an input terminal receiving input data D and an input of inverter INV11. Transfer gate TG11 receives inverted normal operation clock from terminal AB and normal operation clock from terminal A as control signals. Transfer gate TG12 is connected between an output of inverter INV11 and an input of slave latching circuit 3 (at an input of inverter INV31). Transfer gate TG12 receives inverted normal operation clock from terminal AB and normal operation clock from terminal A as control signals. Inverter INV12 has an input connected to receive an output of inverter INV11. Transfer gate TG13 is connected between an output of inverter INV12 and an input of inverter INV11. Transfer gate TG13 receives inverted normal operation clock from terminal AB and normal operation clock from terminal A as control signals. Transfer gate TG11 is turned on when normal operation clock CLK has a low logic level and turned off when normal operation clock CLK has a high logic level. Transfer gates (TG12 and TG13) are turned on when normal operation clock CLK has a high logic level and turned off when normal operation clock CLK has a low logic level.

Second master latching circuit 2 includes transfer gates (TG21 to TG23) and inverters (INV21 and INV22). Transfer gate TG21 is connected between an input terminal receiving a scan-in signal SIN and an input of inverter INV21. Transfer gate TG21 receives inverted first scan clock from terminal S1B and first scan clock from terminal S1 as control signals. Transfer gate TG22 is connected between an input of inverter INV21 and an output terminal providing output signal Q. Transfer gate TG22 receives inverted second scan clock from terminal S2B and second scan clock from terminal S2 as control signals. Inverter INV21 has an output connected to an input of inverter INV22. Transfer gate TG23 is connected between an output of inverter INV22 and an input of inverter INV21. Transfer gate TG22 receives inverted first scan clock from terminal S1B and first scan clock from terminal S1 as control signals. Transfer gate TG21 is turned on when first scan clock SC1 has a high logic level and turned off when first scan clock SC1 has a low logic level. Transfer gate TG22 is turned on when second scan clock SC2 has a high logic level and turned off when second scan clock SC2 has a low logic level. Transfer gate TG23 is turned on when first scan clock SC1 has a low logic level and turned off when first scan clock SC1 has a high logic level.

Slave latching circuit 3 includes transfer gates (TG31 and TG32) and inverters (INV31 and INV32). Inverter INV31 has an input connected to receive an output from first master latching circuit 1. Transfer gate TG31 is connected between an output of inverter INV31 and a terminal providing output signal Q. Inverter INV32 has an input connected to receive output signal Q. Transfer gate TG32 is connected between an output of inverter INV32 and an input of inverter INV31. Transfer gate TG31 is turned on when second scan clock SC2 has a low logic level and turned off when second scan clock SC2 has a high logic level. Transfer gate TG32 is turned on when normal operation clock CLK has a low logic level and turned off when normal operation clock CLK has a high logic level.

Slave latching circuit 3 has an output (i.e., the output of transfer gate TG31) commonly connected with an output (i.e., the output of transfer gate TG22) of second master latching circuit 2. In this way, data Q is provided from transfer gate TG22 in synchronism with a rising edge of second scan clock SC2 when operating in a scan mode of operation.

The operation of conventional positive scan flip-flop 400 will now be explained.

First a normal operation will be explained.

In a normal operation of conventional positive scan flip-flop 400, first scan clock SC1 is at a "0" (logic low) and second scan clock SC2 is held at a "0" (logic low). Thus, transfer gates (TG21 and TG22) in second master latching circuit 2 are both turned off. Transfer gate TG23 in second master latching circuit 2 is turned on. Transfer gate TG31 in slave latching circuit 3 is turned on.

Then, when normal operation clock CLK falls (becomes logic low), transfer gate TG11 in first master latching circuit 1 turns on and input data D is fetched into first master latching circuit 1.

Inverter INV11 inverts the receive input data D to provide an output to transfer gate TG12. Inverter INV12 receives the output of inverter INV11 and provides an output to transfer gate TG13. However, with normal operation clock CLK low, transfer gates (TG12 and TG13) are turned off. Thus, first master latching circuit 1 does not provide an output to slave latching circuit 3 at this time.

Then, when normal operation clock CLK rises (becomes logic high), transfer gates (TG12 and TG13) are turned on and transfer gate TG11 is turned off. Thus, the output of inverter INV12 is provided to the input of inverter INV11 to form a latch that maintains the logic value of the input data D provided when normal operation clock CLK was previously low. Further, the output of inverter INV11 is provided to slave latching circuit 3.

Slave latching circuit 3 inverts the output signal provided by first master latching circuit 1 with inverter INV31. As previously described, second scan clock SC2 is low and transfer gate TG31 is turned on. Thus, the output of inverter INV31 is provided as output data Q. Also, output data Q is provided as an input to inverter INV32 which provides an output to transfer gate TG32. However, with normal operation clock CLK high, transfer gate TG32 is turned off.

Upon a subsequent falling edge of normal operation clock CLK, transfer gate TG11 is turned on and the next value of input data D is fetched into first master latching circuit 1. At this time, transfer gate TG12 is turned off, so that an output is not provided from first master latching circuit 1 to slave latching circuit 3. Also at this time, transfer gate TG32 is turned on and output data Q is latched with inverters (INV31 and INV32) in slave latching circuit 3. In this way, output data Q is maintained.

A scan test operation of conventional positive scan flip-flop 400 will now be described.

In the scan test operation, clock CLK is held at a logic low. Thus, transfer gate TG11 in first master latching circuit 1 is turned on. Also, transfer gate TG32 in slave latching circuit 3 is turned on. Transfer gates (TG12 and TG13) of first master latching circuit 1 are respectively turned off.

Then, when first scan clock SC1 rises (becomes logic high), transfer gate TG21 in second master latching circuit 2 turns on and scan input data SIN is fetched into second master latching circuit 2.

Transfer gate TG21 provides the scan input data SIN to inputs of inverter INV21 and transfer gate TG22. Inverter INV21 inverts the input received and provides an inverted output to an input of inverter INV22. Inverter INV22 inverts the input received and provides an inverted output to transfer gate TG23. With first scan clock SC1 high, transfer gate TG23 is turned off. Also, with second scan clock SC2 low, transfer gate TG22 is turned off. Thus, second master latching circuit 2 does not provide a data output Q and data provided as scan input data SIN is not latched in second master latching circuit 2.

Then, when first scan clock SC1 falls (becomes logic low), transfer gate TG21 turns off and transfer gate TG23 is turned on. Thus, the output of inverter INV22 is provided to the input of inverter INV21 to form a latch that maintains the logic value of the scan input data SIN provided when first scan clock SC1 was previously high.

When second scan clock SC2 rises (becomes logic high), transfer gate TG22 of second master latching circuit 2 is turned on. In this way, second master latching circuit 2 provides data output Q. Inverter INV32 in slave latch circuit 3 receives data output Q and provides an inverted output to transfer gate TG32. With normal clock signal CLK low, transfer gate TG32 is turned on. Inverter INV31 thus receives the output from inverter INV32 and provides an inverted output to transfer gate TG31. With second scan clock SC2 high, transfer gate TG31 is turned off. Thus, slave latching circuit 3 does not form a latch at this time.

When second scan clock SC2 falls (becomes low), transfer gate TG22 in second master latching circuit 2 is turned off. However, at this time, transfer gate TG31 in slave latching circuit 3 turns on. In this way, slave latching circuit 3 forms a latch (with inverters INV31 and INV32)) to maintain the value of output data Q.

FIG. 5 is a circuit schematic diagram of a conventional scan flip-flop given the general reference character 500. Conventional scan flip-flop 500 is a negative F/F and is hereinafter referred to as a conventional negative scan F/F 500.

Conventional negative scan flip-flop 500 includes similar constituents as conventional positive scan flip-flop 400. Such constituents are referred to by the same general reference characters.

Conventional negative scan flip-flop 500 includes a first master latching circuit 5, a second master latching circuit 6, a slave latching circuit 7, and a clock circuit 8.

Conventional negative scan flip-flop 500 differs from conventional positive scan flip-flop 400 in that connections of control signals (AB and A) transfer gates (TG11 to TG13) of first master latching circuit 5 in conventional negative scan flip-flop 500 are connected oppositely as compared to first master latching circuit 1 in conventional positive scan flip-flop 400. Also, connections of control signals (AB and A) transfer gate TG32 of slave latching circuit 7 in conventional negative scan flip-flop 500 are connected oppositely as compared to slave latching circuit 3 in conventional positive scan flip-flop 400.

Also, the operation of conventional negative scan flip-flop 500 is the same as the operation of conventional positive scan flip-flop 400, except in the normal operation input data D is fetched into first master latching circuit 5 in response to a rising edge of a normal clock signal CLKB and the fetched data is provided as data output Q in response to a falling edge of normal clock signal CLKB. Also, in a scan test operation is executed, normal clock signal CLKB is held at a logic high.

Thus, a detailed description of the operation of conventional negative scan flip-flop 500 is omitted.

In conventional positive scan flip-flop 400 it is necessary to fix normal clock signal CLK at a logic low to operate in a scan test mode. However, in conventional negative scan flip-flop 500 it is necessary to fix normal clock signal CLKB at a logic high to operate in a scan test mode.

Because normal clock signal CLK must be exclusively set at either a logic high or a logic low, it may be impossible to conduct a scan test when scan flip-flops operating as a positive flip-flop are included on the same LS1 as scan flip-flops operating as a negative flip-flop.

Referring now to FIG. 6, a block schematic diagram of a conventional semiconductor device including conventional scan flip-flops is set forth and given the general reference character 600.

Conventional semiconductor device 600 includes scan flip-flops (602 and 604), an OR gate 606, and an AND gate 608. Scan flip-flop 602 operates as a positive flip-flop and scan flip-flop 604 operates as a negative flip-flop.

A clock CLK is supplied to scan flip-flop 602 by OR gate 606. A clock CLKB is supplied to scan flip-flop 604 by AND gate 608. OR gate 606 receives a control signal SCN at one input and a user clock at another input. AND gate 608 receives a control signal SCNB at one input and a user clock at another input.

Control signal SCN is set to logic high ("1") to fix clock CLK to a logic high for scan flip-flop 606 (a positive flip-flop) to operate in the scan test mode. Control signal SCNB is set to a logic low ("0") to fix clock CLKB to a logic low for scan flip-flop 604 (a negative flip-flop) to operate in the scan test mode.

However, inserting OR gate 606 and/or AND gate 608 in a clock line can increase the difficulty to in optimizing (compensating for) clock skews between flip-flops. In this respect, clock lines themselves are typically designed by using a layout technique, such as a CTS (Clock Tree Synthesis) technique, for optimizing clock skews. However, an existence of logic gates in clock lines makes it difficult to adjust clock skews even when using the CTS technique.

The present embodiments have been set forth to reduce such problems encountered when using the conventional approach.

In view of the above discussion, it would be desirable to provide a scan test flip-flop that may be capable of executing a scan test without obstructing a skew adjustment of clock lines.

SUMMARY OF THE INVENTION

According to the present embodiments, a scan flip-flop that may operate as a positive flip-flop or a negative flip-flop in a normal operating mode is disclosed. A scan flip-flop may include a master latching circuit, a slave latching circuit, and a clock circuit. A clock circuit may receive a first signal, a control signal, and a mode signal. A first signal may select between a positive flip-flop operation and a negative flip-flop operation when in a normal operation mode. A mode signal may select between a normal operation mode and a scan test mode. A control signal may disable a first signal so that the scan flip-flop may operate in a known mode, such as a positive flip-flop, regardless as to the value of the first signal. In this way, a scan flip-flop may have reduced logic gates in clock lines as compared to a conventional approach.

According to one aspect of the embodiments, a scan flip-flop may have a normal operation and a scan test operation. The scan flip-flop may include a master latching circuit, a slave latching circuit, and a clock circuit. The master latching circuit may latch a data input in response to a normal clock in the normal operation and may latch a scan-in signal in response to a first scan clock in the scan test operation. The slave latching circuit may provide the latched data input from the master latching circuit in synchronism with the normal clock in the normal operation and may provide the latched scan-in signal from the master latching circuit in synchronism with the second scan clock in the scan test operation. The clock circuit may receive a first switching signal. The first switching signal may set whether the master latching circuit and slave latching circuit operates as a positive flip-flop or a negative flip-flop in the normal operation.

According to another aspect of the embodiments, the clock circuit may receive a control signal that may enable the setting between the positive flip-flop and negative flip-flop operations in accordance with the first switching signal.

According to another aspect of the embodiments, the clock circuit may receive an operation selection signal that selects between the normal operation and the scan test operation.

According to another aspect of the embodiments, the master latching circuit may include a first latch. The first latch may latch the data input in response to the data input in response to the normal clock in the normal operation and may latch the scan-in signal in response to the firs scan clock in the scan test operation.

According to another aspect of the embodiments, the slave latching circuit may provide the latched data input from the master latching circuit at a data output terminal and may provide the latched scan-in signal from the master latching circuit at a scan output terminal.

According to another aspect of the embodiments, when the master latching circuit and slave latching circuit operates as a positive flip-flop, the data input may be latched in the master latching circuit in response to a rising edge of the normal clock. When the master latching circuit and slave latching circuit operates as a negative flip-flop, the data input may be latched in the slave latching circuit in response to a negative edge of the normal clock.

According to another aspect of the embodiments, the slave latching circuit may latch the provided data input in response to the normal clock when a subsequent dta input is being loaded in the master latching circuit.

According to another aspect of the embodiments, a scan flip-flop may have a normal operation for operating as a normal flip-flop receiving data input and a scan test operation for operating as a flip-flop receiving a scan-in signal as a test pattern signal and a first and second scan clock as test clocks. The scan flip-flop may include a master latching circuit, a slave latching circuit, and a clock circuit. The master latching circuit may temporarily hold the data input in response to a normal clock in the normal operation and may temporarily hold the scan-in signal in response to the first scan clock in the scan test operation. The slave latching circuit may output the temporarily held data input in the master latching circuit in response to the normal clock in the normal operation and may output the temporarily held scan-in signal in the master latching circuit in response to the second scan clock in the scan test operation. The clock circuit may receive an externally applied first switching signal and an externally applied second switching signal. The first switching signal may set the master latching circuit and slave latching circuit as one of a positive flip-flop that outputs the temporarily held data input in response to a rising edge of the normal clock or a negative flip-flop that outputs the temporarily held data input in response to a falling edge of the normal clock. The second switching signal may switch the master latching circuit and the slave latching circuit into the normal operation or the scan test operation.

According to another aspect of the embodiments, the clock circuit may receive an externally applied third switching signal that sets the master latching circuit and slave latching circuit as a positive flip-flop irrespectively of a value of the first switching signal.

According to another aspect of the embodiments, the master latching circuit may include a first transfer gate, a second transfer gate, a first gate circuit, a second gate circuit, and a third transfer gate. The first transfer gate may be connected between the input data and a first gate input and may inhibit or allow loading of the input data into the master latching circuit in response to the normal clock. The second transfer gate may be connected between the scan-in signal and the first gate input and may inhibit or allow loading of the scan-in signal into the master latching circuit in response to the first scan clock. The first gate circuit may provide a first gate output. The second gate circuit may receive the first gate output at a second gate input and may provide a second gate output. The third transfer gate may be connected between the second gate output and the first gate input to form a first latch. The first latch may include the first and second gate circuits and the third transfer gate. The second latching circuit may include a fourth transfer gate, a third gate circuit, a fourth gate circuit, and a fifth transfer gate. The fourth transfer gate may be connected between an output of the master latching circuit and a third gate input and may inhibit or allow loading of the output of the master latch into the slave latching circuit in response to the normal clock. The third gate circuit may provide a third gate output. The fourth gate circuit may receive the third gate output at a fourth gate input and may provide a fourth gate output. The fifth transfer gate may be connected between the fourth gate output and the third gate input to form a second latch. The second latch may include the third gate circuit, the fourth gate circuit and the fifth transfer gate.

According to another aspect of the embodiments, the clock circuit may set the master latching circuit and the slave latching circuit as the positive flip-flop or the negative flip-flop by controlling the first transfer gate, second transfer gate, third transfer gate, and fourth transfer gate.

According to another aspect of the embodiments, the clock circuit may include a first logic gate and a second logic gate. The first logic gate may receive the second switching signal, the normal clock, and the first switching signal and may generate a first control signal that sets the master latching circuit and the slave latching circuit as the positive flip-flop in the normal operation. The second logic gate may receive the second switching signal, the normal clock, and the first switching signal and may generate the first control signal that sets the master latching circuit and slave latching circuit as the negative flip-flop in the normal operation. An output of the first logic gate may be fixed by the first switching signal when the master latching circuit and slave latching circuit are collectively set as the negative flip-flop. An output of the second logic gate may be fixed by the first switching signal when the master latching circuit and slave latching circuit are collectively set as the positive flip-flop.

According to another aspect of the embodiments, the clock circuit may receive an externally applied third switching signal that sets the master latching circuit and slave latching circuit as the positive flip-flop irrespectively of the value of the first switching signal.

According to another aspect of the embodiments, when the master latching circuit and slave latching circuit operate as a positive flip-flop, the slave latching circuit may output the temporarily held data input in the master latching circuit in response to a rising edge of the normal clock. When the master latching circuit and slave latching circuit operate as a negative flip-flop, the slave latching circuit may output the temporarily held data input in the master latching circuit in response to a falling edge of the normal clock.

According to another aspect of the embodiments, a semiconductor integrated circuit may include a scan flip-flop and a clock circuit. The scan flip-flop may have a normal mode and a scan test mode. The scan flip-flop may receive a normal data input, a scan data input, and a first clock signal and may provide a normal data output and a scan data output. The clock circuit may receive a normal clock signal, a first control signal, and a scan test signal and may provide the first clock signal. The first control signal may have a positive flip-flop logic level and a negative flip-flop logic level. The scan test signal may have a scan test mode logic level and a normal mode logic level. The scan flip-flop may operate as a positive flip-flop when the first control signal has the positive flip-flop logic level and the scan test signal has the normal mode logic level. The scan flip-flop may operate as a negative flip-flop when the first control signal has the negative flip-flop logic level and the scan test signal has the normal mode logic level.

According to another aspect of the embodiments, the scan flip-flop may include a master latch and a slave latch. The master latch may receive the normal data input and the scan data input and provide a master latch output. The slave latch may receive the master latch output and provide the normal data output and the scan data output.

According to another aspect of the embodiments, the first clock signal may have an inverse logic relationship with respect to the normal clock signal when the scan flip-flop operates as a negative flip-flop and a non-inverse logic relationship with respect to the normal clock signal when the scan flip-flop operates as a positive flip-flop.

According to another aspect of the embodiments, the clock circuit may provide a second clock signal to the scan flip-flop. The first and second clock signals may be complementary.

According to another aspect of the embodiments, the clock circuit may receive a second control signal. The second control signal may have a first logic level and a second logic level. The scan flip-flop may be set as a positive flip-flop irrespective of the first control signal when the second controls signal has the first logic level.

According to another aspect of the embodiments, the scan flip-flop may receive a first scan clock and a normal scan clock. When in the test mode, scan data input may be loaded into the scan flip-flop in response to the first scan clock and scan data output may be provided in response to the second scan clock.

DETAILED DESCRIPTION OF THE EMBODIMENTS

Various embodiments of the present invention will now be described in detail with reference to a number of drawings.

Figure 1A:
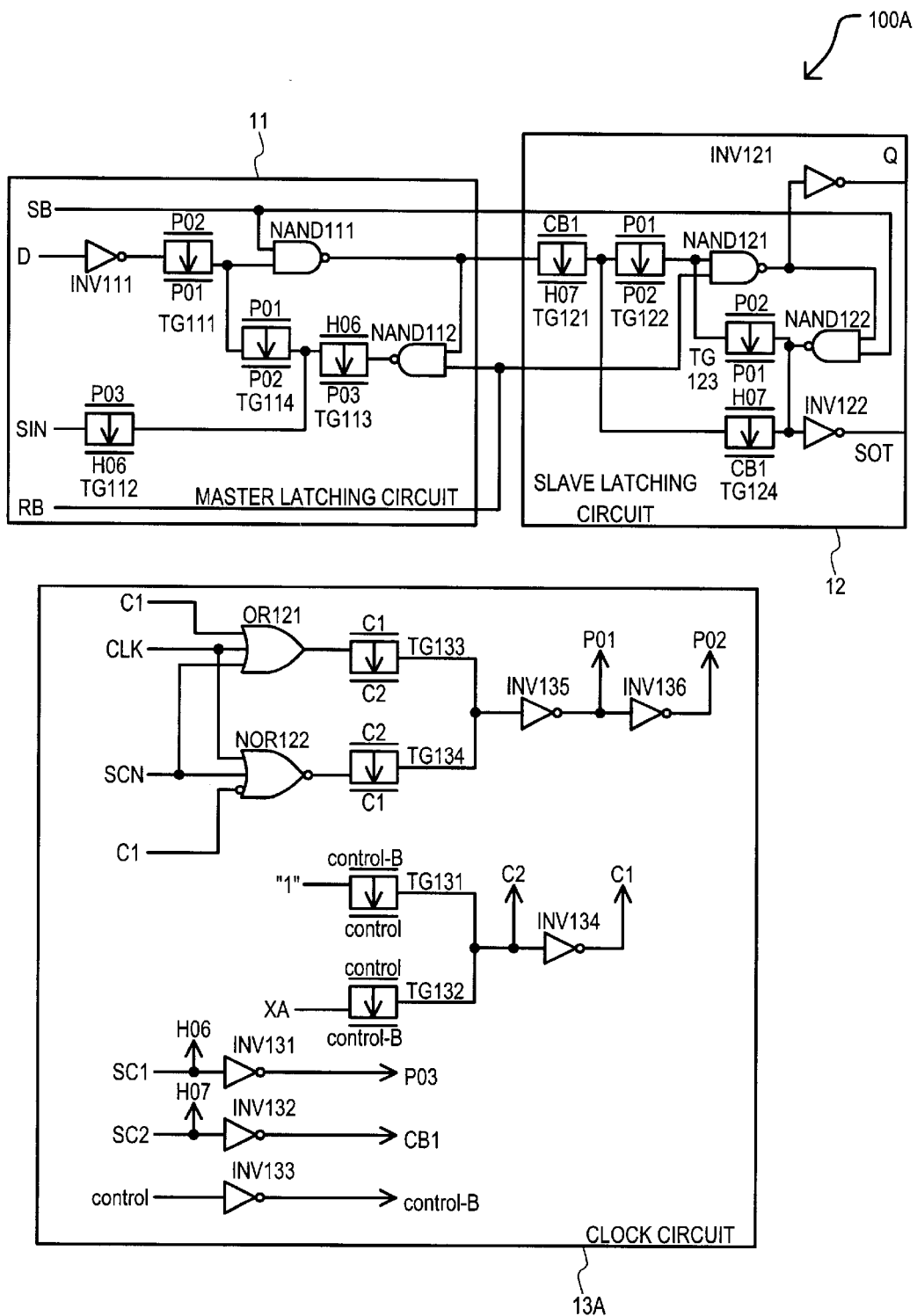
FIG. 1A is a circuit schematic diagram of a scan flip-flop according to a first embodiment.

Referring now to FIG. 1A, a circuit schematic diagram of a scan flip-flop according to an embodiment is set forth and given the general reference character 100A.

Scan flip-flop 100A may include a master latching circuit 11, a slave latching circuit 12, and a clock circuit 13A. Master latching circuit 11 and slave latching circuit 12 may be commonly used in a normal operation and a scan test operation. Clock circuit 13A may generate signals for controlling master latching circuit 11 and slave latching circuit 12 in accordance with a normal operation clock CLK, a first scan clock SC1, and a second scan clock SC2.

Clock circuit 13A may include inverters (INV131 to INV136), transfer gates (TG131 to TG134), an OR gate OR121, and a NOR gate NOR122. Inverter INV131 may have an input terminal H06 connected to receive first scan clock SC1 and may have an output terminal P03 connected to provide an inverted first scan clock. Inverter INV132 may have an input terminal H07 connected to receive second scan clock SC2 and may have an output terminal CB1 connected to provide an inverted second scan clock. Inverter INV133 may receive a control signal control and provide an inverted control signal control-B. Control signal control and inverted control signal control-B may be connected to control terminals of transfer gates (TG131 and TG132) in a reverse manner with respect to each other to control whether scan flip-flop 100A operates as a positive scan flip-flop or negative scan flip-flop. Transfer gate TG131 may receive a logic high ("1") at an input and may provide a signal C2 at an output. Transfer gate TG132 may receive a signal XA at an input and may provide a signal C2 at an output. Inverter INV134 may have an input connected to receive signal C2 and an output connected to provide a signal C1.

OR gate OR121 may receive signal C1, normal operation clock CLK, and control signal SCN at inputs and may provide a logical summation output to an input of transfer gate TG133. Control signal SCN may control switching between a normal operation and a scan test operation. NOR gate NOR122 may receive inverted signal C1 and control signal SCN at inputs and normal operation clock CLK at an inverted input and may provide a logical summation output to an input of transfer gate TG134. Transfer gates (TG133 and TG134) may have outputs commonly connected to an input of inverter INV135. Transfer gates (TG133 and TG134) may have control terminals connected to signals (C1 and C2) in a reverse manner with respect to each other. Inverter INV135 may provide signal P01 at an output. Inverter INV136 may receive signal P01 at an input and provide signal P02 at an output.

Transfer gate TG131 may be turned on when control signal control is logic high ("1") and may be turned off when control signal control is logic low ("0"). Transfer gate TG132 may be turned on when control signal control is logic low ("0") and may be turned off when control signal control is logic high ("1"). Transfer gate TG133 may be turned on when signal C2 is logic high ("1") and turned off when signal C2 is logic low ("0"). Transfer gate TG134 may be turned on when signal C2 is logic low ("0") and turned on when signal C2 is logic high ("1"). Thus, if control signal control is logic low and signal XA is logic high, transfer gate TG133 may be turned on. If control signal control is logic low and signal XA is logic low, transfer gate TG134 may be turned on.

Master latching circuit 11 may include an inverter INV111, NAND gates (NAND111 and NAND112), and transfer gates (TG111 to TG114). Inverter INV111 may receive input data D and provide an output to an input of transfer gate TG111. Transfer gate TG111 may have control terminals connected to receive signals (P01 and P02) and may provide an output to an input of NAND gate NAND111. Transfer gate TG111 may enable or disable loading of input data D into master latching circuit 11. Transfer gate TG112 may receive a scan-in signal SIN as an input and may provide an output at a common connection between an input of transfer gate TG114 and an output of transfer gate TG113. Transfer gate TG112 may receive signal P03 and first scan clock SC1 from terminal H06 at control terminals. Transfer gate TG112 may enable or disable loading of scan-in signal SIN into master latching circuit 11.

NAND gate NAND111 may receive a set-bar signal SB at one input and may have another input connected at a common connection between an output of transfer gate TG111 and an output of transfer gate TG114. NAND gate NAND111 may provide an inverted logical product as an output of master latching circuit 11. The output of NAND gate NAND111 may also be connected to an input of NAND gate NAND112. NAND gate NAND112 may receive a reset-bar signal RB at another input and may provide an output to an input of transfer gate TG113. Transfer gate TG113 may receive first scan clock SC1 from terminal H06 and signal P03 at control terminals and may provide an output as an input to transfer gate TG114. Transfer gate TG114 may receive signals (P01 and P02) at control terminals and may provide an output as an input to NAND gate NAND111.

Transfer gate TG111 may receive signals (P01 and P02) at control terminals. Transfer gate TG111 may be turned on when normal operation clock CLK is logic low ("0") and scan flip-flop 100 and control signal SCN is logic low ("0"). Transfer gate 114 may be turned on when normal clock CLK is logic high ("1") and control signal SCN is logic low ("0"). Transfer gate TG112 may be turned on when first scan clock SC1 is logic high ("1"). Transfer gate TG113 may be turned on when first scan clock SC1 is logic low ("0").

Slave latching circuit 12 may include transfer gates (TG121 to TG124), NAND gates (NAND121 and NAND122), and inverters (INV121 and INV122). Transfer gate TG121 may receive an output signal of NAND gate NAND111 of master latching circuit 11 as an input. Transfer gate TG121 may receive signal CB1 and second scan clock SC2 from terminal H07 at control terminals and may provide an output as an input to transfer gate TG122. Transfer gate TG121 may control the loading of an output from master latching circuit 11 into slave latching circuit 12. Transfer gate TG122 may have an input connected to a common connection of outputs of transfer gates (TG121 and TG124). Transfer gate TG122 may have control terminals connected to receive signals (P01 and P02) and may provide an output to an input of NAND gate NAND121. NAND gate 121 may receive reset-bar signal RB at another input and may provide an output to an input of inverter INV121 and NAND gate NAND122. Inverter INV121 may provide an output Q at an output terminal. NAND gate 122 may receive a set-bar signal SB at an input and may provide an output as an input to transfer gates (TG123 and TG124) and inverter INV122. Inverter INV122 may provide a scan output SOT at an output terminal. Transfer gate TG123 may receive signals (P01 and P02) at control terminals and may have an output connected to a common connection node between an output of transfer gate TG122 and an input of NAND gate NAND121. Transfer gate TG124 may receive signal CB1 and second scan clock SC2 from terminal H07 at control terminals and may provide an output to a common connection node between an output of transfer gate TG121 and an input of transfer gate TG122.

Transfer gate TG121 may be turned on when second scan clock SC2 is logic high ("1"). Transfer gate TG124 may be turned on when second scan clock SC2 is logic low ("0"). Transfer gate TG122 may be turned on when normal clock signal CLK is logic high ("1") and control signal SCN is logic low ("0"). Transfer gate 123 may turned on when normal clock signal CLK is logic low ("0") and control signal SCN is logic low ("0").

Set-bar signal SB and reset-bar signal RB may not be required. In such a case, NAND gates (NAND111, NAND112, NAND121, and NAND122) may be replaced by inverters, respectively. Note, set-bar signal SB may be provided for forcibly setting an output Q of flip-flop circuit 100A at a logic high ("1") when a set-bar signal SB having a logic low ("0") is received. Reset-bar signal RB may be provided for forcibly setting an output Q of flip-flop circuit 100A at a logic low ("0") when a set-bar signal SB having a logic high ("1") is received.

The operation of scan flip-flop 100A of FIG. 1A will now be explained.

Scan flip-flop 100A may operate in a normal operation or a scan test operation.

A normal operation may occur when control signal control is logic low ("0"), control signal SCN is logic low ("0"), first scan clock SC1 is logic low ("0"), and second scan clock SC2 is logic low ("1"). When in a normal operation, scan flip-flop 100 may operate as a positive flip-flop (positive F/F) when signal XA is logic high ("1") and may operate as a negative flip-flop (negative F/F) when signal XA is logic low ("0").

The operation of scan flip-flop 100A in a normal operation will now be explained. In a normal operation, scan flip-flop 100A may receive control signal control having a logic low ("0"), a control signal SCN having a logic low ("0"), and signal XA having a logic high ("1").

In a normal operation, scan flip-flop 100A may receive a first scan clock SC1 having a logic low ("0") and a second scan clock SC2 having a logic high ("1"). With first scan clock SC1 having a logic low, transfer gate TG112 may be turned off and transfer gate TG113 may be turned on in master latching circuit 12. In this way, scan-in signal SIN may be inhibited from being loaded into master latching circuit 11. Further, with second scan clock SC2 having a logic high, transfer gate TG121 may be turned on and transfer gate TG124 may be turned off.

In such a state, when normal clock CLK falls (becomes low), transfer gate TG111 may be turned on and input data D may be provided to an input of NAND gate NAND111 through inverter INV111 and transfer gate TG111. In this way, input data D may be loaded into master latching circuit 11.

With set-bar signal SB logic high, NAND gate NAND111 may invert the signal received from transfer gate TG111 to provide an output of master latching circuit 11 that may be received as an input to transfer gate TG121 in slave latching circuit 12. With reset-bar signal RB logic high, NAND gate NAND112 may invert the output of NAND gate NAND111 to provide an output that may be received as an input to transfer gate TG113. Because first scan clock SC1 is logic low, transfer gate TG113 may be turned on to transmit the output of NAND gate NAND112 to an input to transfer gate TG114. Because normal clock CLK is logic low at this time, transfer gate TG114 may be turned off, so that a data value may not be latched in master latching circuit 11.

Next, when normal clock CLK rises (becomes logic high), transfer gate TG111 may be turned off thus inhibiting the loading of input data D to master latching circuit 11. Also, transfer gate TG114 may be turned on. In this way, transfer gates (TG113 and TG114) and NAND gates (NAND111 and NAND112) may form a latch so that the value of input data D (loaded when normal clock CLK was low) may be held in master latching circuit 11.

With second scan clock SC2 remaining high, transfer gate TG121 of slave latching circuit 12 may remain turned on. With normal clock CLK high, transfer gate TG122 may turn on and an output of NAND gate NAND111 may be applied to an input of NAND gate NAND121 through transfer gates (TG121 and TG122). In this way, data stored in master latch 11 may be loaded into slave latch 12. With reset-bar signal RB high, NAND gate NAND121 may invert the data received and provide an output to an input of NAND gate NAND122 and inverter INV121. With set-bar signal SB high, NAND gate NAND122 may invert the data received and provide an output to an input of transfer gate TG123 and an input of inverter INV122. With normal clock CLK high, transfer gate TG123 may be turned off, so that a data value may not be latched in slave latching circuit 12. Inverter INV121 may provide an output Q of the data loaded into slave latching circuit 12.

Subsequently, when normal clock CLK falls (becomes low), transfer gate TG111 may be turned on and a next value of input data D may be loaded into master latching circuit 11. At this time, transfer gate TG122 may be turned off to inhibit data from being loaded into slave latching circuit 12 from master latching circuit 11. Transfer gate TG123 may be turned on. In this way, transfer gate TG123 and NAND gates (NAND121 and NAND122) may form a latch so that the value of output Q (loaded when normal clock CLK was high) may be held in slave latching circuit 12.

Note, scan flip-flop 100A may operate as a negative flip-flop by setting control signal control to a logic low, control signal SCN to a logic low, and signal XA to a logic low. In this case, scan-flip-flop 100A may operate as a negative flip-flop in the same manner as the operation of a positive flip-flop as described above, except input data D may be loaded into master latching circuit 11 in response to a rising edge of normal clock CLK and transferred into slave latching circuit 12 and provided at output Q in response to a falling edge of normal clock CLK. Thus, a detailed explanation of the operation of scan flip-flop 100A as a negative flip-flop shall be omitted.

The operation of scan flip-flop 100A in a scan operation will now be explained.

A scan test operation may occur when control signal SCN is logic high ("1") and normal clock CLK is logic high ("1"). With control signal SCN high, transfer gate TG111 may be turned and transfer gate TG114 may be turned on in master latching circuit 11. Further, transfer gate TG112 may be turned on and transfer gate TG123 may be turned off in slave latching circuit 12.

In such a state, when first scan clock SC1 rises (becomes high), transfer gate TG112 may be turned on and scan-in signal SIN may be loaded into master latching circuit 11.

Transfer gate TG112 may provide scan-in signal SIN to an input of transfer gate TG114. With control signal SCN high, transfer gate TG114 may pass scan-in signal SIN to an input of NAND gate NAND111. With set-bar signal SB logic high, NAND gate NAND111 may invert the signal received from transfer gate TG114 to provide an output of master latching circuit 11 that may be received as an input to transfer gate TG121 in slave latching circuit 12. With reset-bar signal RB logic high, NAND gate NAND112 may invert the output of NAND gate NAND111 to provide an output that may be received as an input to transfer gate TG113. Because first scan clock SC1 is high, transfer gate TG113 may be turned off, so that a data value may not be latched in master latching circuit 11 at this time.

At this time, because second scan clock SC2 is low, transfer gate TG121 may be turned off and a data value provided by NAND gate 111 in master latching circuit 11 may not be loaded into slave latching circuit 12.

Next, when first scan clock SC1 falls (becomes logic low), transfer gate TG112 may be turned off thus inhibiting the loading of scan-in data SIN to master latching circuit 11. Also, transfer gate TG113 may be turned on. In this way, transfer gates (TG113 and TG114) and NAND gates (NAND111 and NAND112) may form a latch so that the value of scan-in data SIN (loaded when first scan clock CLK was high) may be held in master latching circuit 11.

Next, second scan clock SC2 may rise (become logic high). With second scan clock SC2 high, transfer gate TG121 in slave latching circuit 12 may turn on. At this time, because control signal SCN remains high, transfer gate TG122 may remain on. With transfer gates (TG121 and TG122) turned on, an output of NAND gate NAND111 may be applied to an input of NAND gate 121. In this way, data stored in master latch 11 may be loaded into slave latch 12. With reset-bar signal RB high, NAND gate NAND121 may invert the data received and provide an output to an input of NAND gate NAND122 and inverter INV121. With set-bar signal SB high, NAND gate NAND122 may invert the data received and provide an output to an input of transfer gates (TG123 and TG124) and an input of inverter INV122. With normal clock CLK high, transfer gate TG123 may be turned off. Also, with second scan clock SC2 high, transfer gate TG124 may be turned off, so that a data value may not be latched in slave latching circuit 12. Inverter INV121 may provide an output Q of the data loaded into slave latching circuit 12. Inverter INV122 may provide a scan output SOT. The value of scan output SOT may correspond to the value of scan-in signal SIN previously loaded into master latching circuit 11 in response to a rising edge of first scan clock SC1.

Subsequently, when second clock SC2 falls (becomes low), transfer gate TG121 may be turned off to inhibit data from being loaded into slave latching circuit 12 from master latching circuit 11. Also, at this time, transfer gate TG124 may be turned on. In this way, transfer gates (TG122 and TG124) and NAND gates (NAND121 and NAND122) may form a latch so that the value of scan output SOT (loaded when second scan clock SC2 was high) may be held in slave latching circuit 12.

Scan flip-flop 100A may reduce logic gates in clock lines which may be required in a conventional approach. In this way, a scan test may be performed with reduced clock skew adjustments.

Control signal control may be set logic high ("1") to provide a scan flip-flop operating as a positive flip-flop without regard to the value (high, low, or high impedance) of signal XA. Thus, a scan operation as described above may be performed by setting control signal SCN to a logic high ("1"). In this way, it may be possible to perform a scan test even when signal XA is in an unknown state, for example, at a certain manufacturing stage of the LSI. Also, in the event only a positive flip-flop is needed, control signal control may be forced high, for example through bonding or the like, as just an example. In doing so, signal XA may have no effect on the operation of scan flip-flop 100A.

Further, clock circuit 13A of scan flip-flop 100A may include circuitry which may reduce power consumption. By providing signals (C1 and C2) to OR and NOR gates (OR121 and NOR122) respectively in clock circuit 13A, only one of OR and NOR gates (OR121 or NOR122) may be enabled in a normal mode (in accordance with whether a positive flip-flop or negative flip-flop is desired). In this way, it may only be necessary for one of OR and NOR gates (OR121 and NOR122) to switch in response to normal clock signal CLK even though transfer gates (TG133 and TG134) may only be logically necessary to make a selection as to which OR or NOR gate (OR121 or NOR122) may provide signals (P01 and P02).

Thus, scan flip-flop 100A may prevent gates which are not necessary when a function is selected (such as positive or negative flip-flop in a normal operation) from switching. By reducing gate switching, current consumption may be reduced and overall power consumption may be reduced.

Although scan flip-flop 100A includes control signals (C1 and C2) to be generated internally. Control signals (C1 and C2) may be externally provided, as just one example. In such a situation, the operating state of scan flip-flop 100A may be more freely controlled.

Figure 1B:
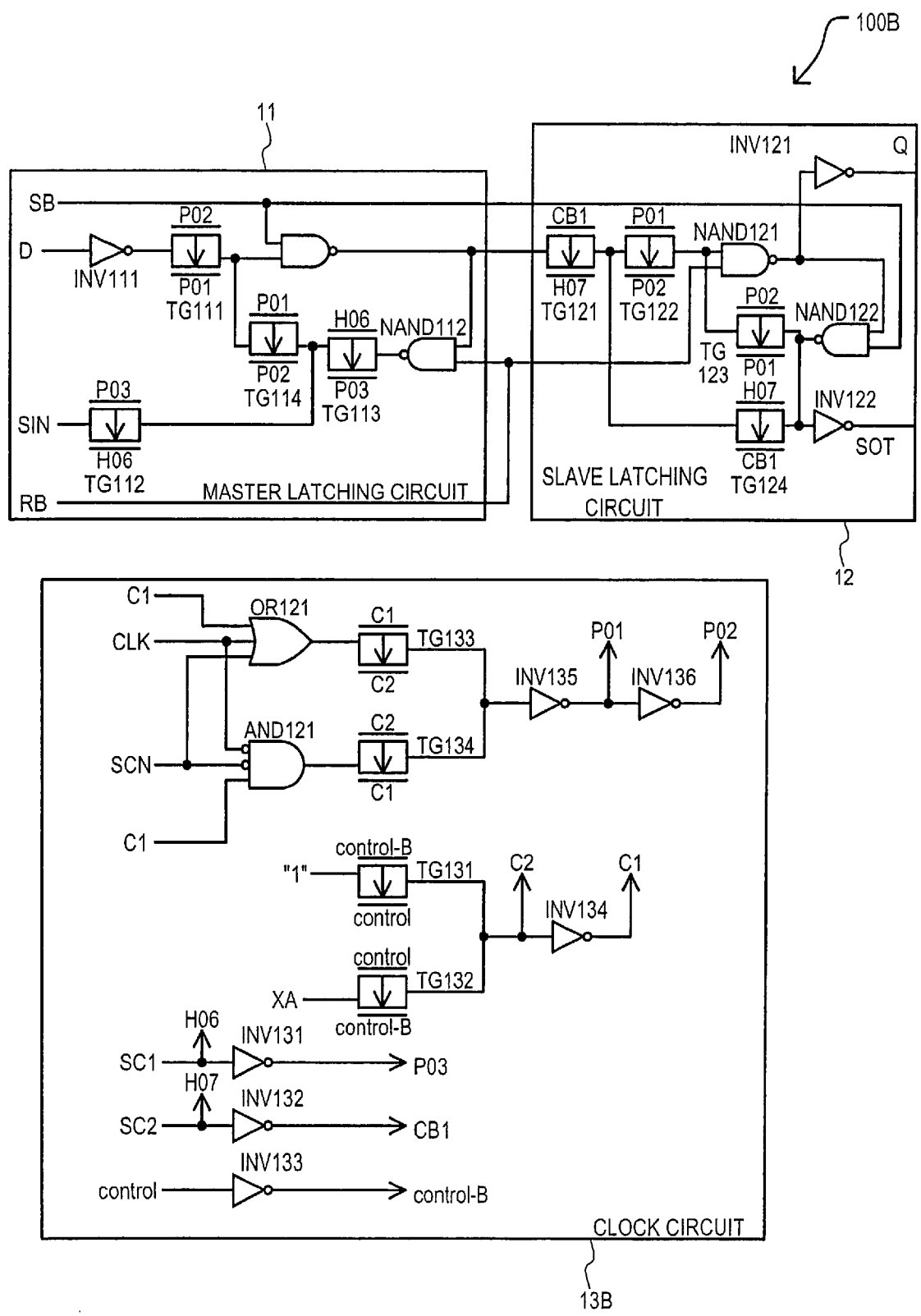
FIG. 1B is a circuit schematic diagram of a scan flip-flop according to a second embodiment.

Referring now to FIG. 1B, a circuit schematic diagram of a scan flip-flop according to a second embodiment is set forth and given the general reference character 100B. Scan flip-flop 100B may differ from scan flip-flop 100A in that a clock circuit 13B may be used instead of clock circuit 13A.

Clock circuit 13B may differ from clock circuit 13A in that NOR gate NOR122 may be replaced with AND gate AND121. AND gate AND121 may receive control signal C1 at an input, normal clock signal CLK at an inverted input, and control signal SCN at an inverted input.

Scan flip-flop 100B may operate in the same essential manner as scan flip-flop 100A and thus the description of the operation is omitted.

Figure 2A:
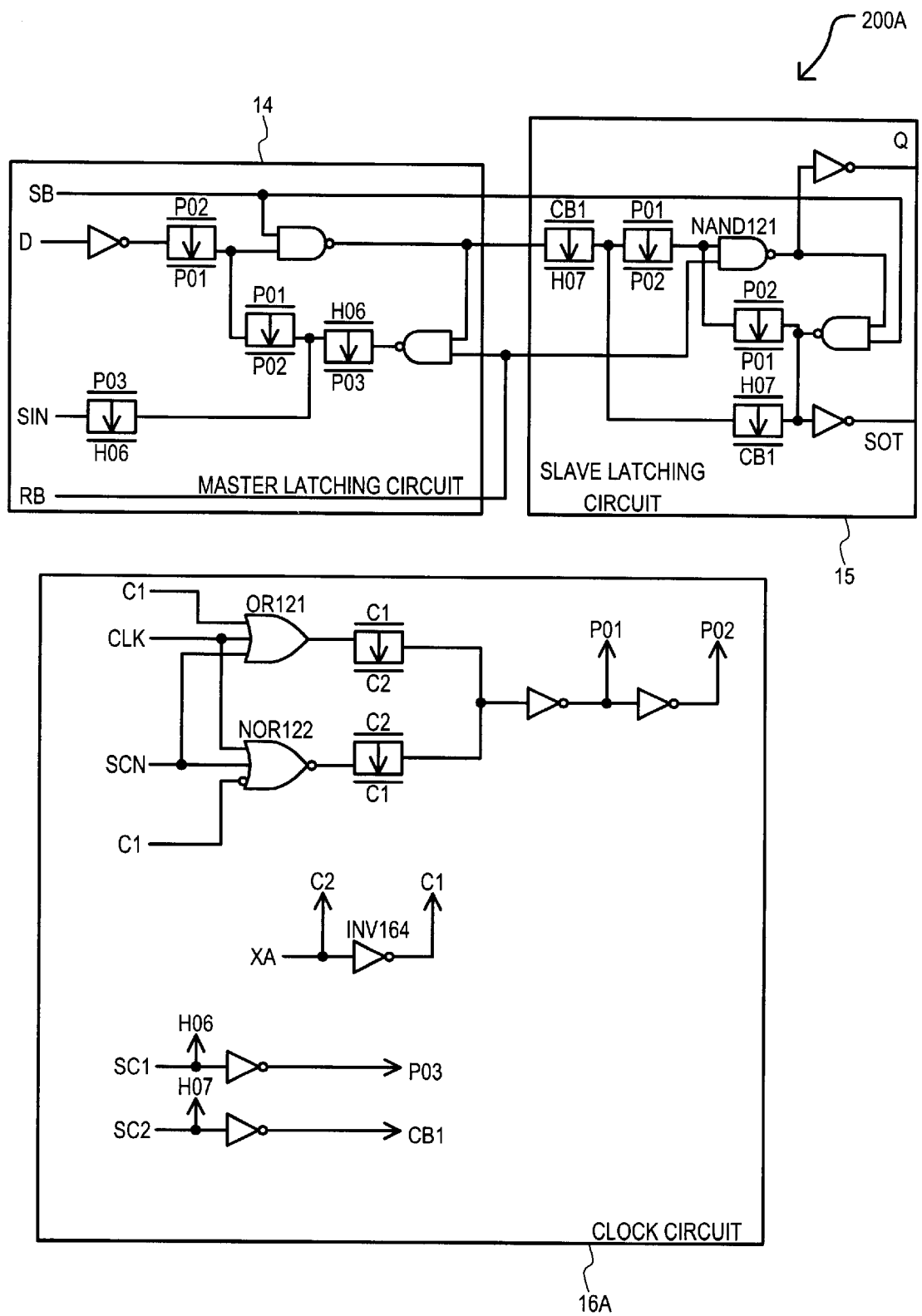
FIG. 2A is a circuit schematic diagram of a scan flip-flop according to a third embodiment.

Referring now to FIG. 2A, a circuit schematic diagram of a scan flip-flop according to a third embodiment is set forth and given the general reference character 200A.

Scan flip-flop 200A may include a master latching circuit 14, a slave latching circuit 15, and a clock circuit 16A.

Scan flip-flop 200A may differ from scan flip-flop 100A in that clock circuit 16A may not include a control signal control. Thus, clock circuit 16A of scan flip-flop 200A may differ from clock circuit 13A of scan flip-flop 100A in that transfer gates (TG131 and TG132) may be eliminated. Instead, in clock circuit 16A, signal XA may directly provide signal C2. An inverter INV164 may receive signal XA and provide signal C1.

Master latching circuit 14 may be essentially the same in construction and operation as master latching circuit 11 of scan flip-flop 100A. Slave latching circuit 15 may be essentially the same in construction and operation as slave latching circuit 15 of scan flip-flop 100A. Thus, the explanation of master latching circuit 14 and slave latching circuit 15 shall be omitted.

Scan flip-flop 200A may operate in the same manner as scan flip-flop 100A, except control signal control is not provided, so that signal XA may not be disabled. Thus, signal XA may unconditionally select a positive or negative flip-flop in a normal operation.

Scan flip-flop 200A may reduce logic gates in clock lines which may be required in a conventional approach. In this way, a scan test may be performed with reduced clock skew adjustments.

Figure 2B:
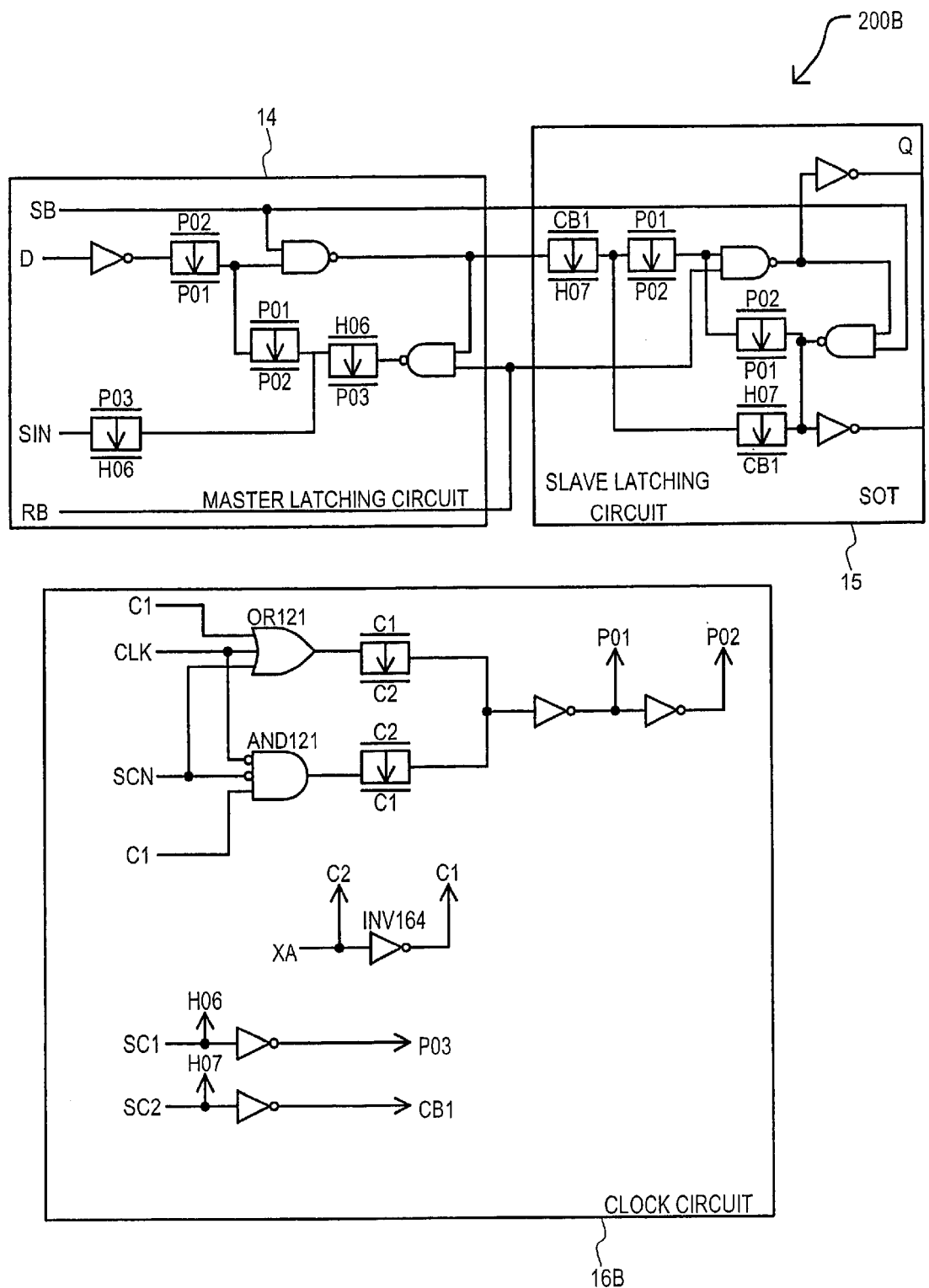
FIG. 2B is a circuit schematic diagram of a scan flip-flop according to a fourth embodiment.

Referring now to FIG. 2B, a circuit schematic diagram of a scan flip-flop according to a fourth embodiment is set forth and given the general reference character 200B. Scan flip-flop 200B may differ from scan flip-flop 200A in that a clock circuit 16B may be used instead of clock circuit 16A.

Clock circuit 16B may differ from clock circuit 16A in that NOR gate NOR122 may be replaced with AND gate AND121. AND gate AND121 may receive control signal C1 at an input, normal clock signal CLK at an inverted input, and control signal SCN at an inverted input.

Scan flip-flop 200B may operate in the same essential manner as scan flip-flop 200A and thus the description of the operation is omitted.

Figure 3:
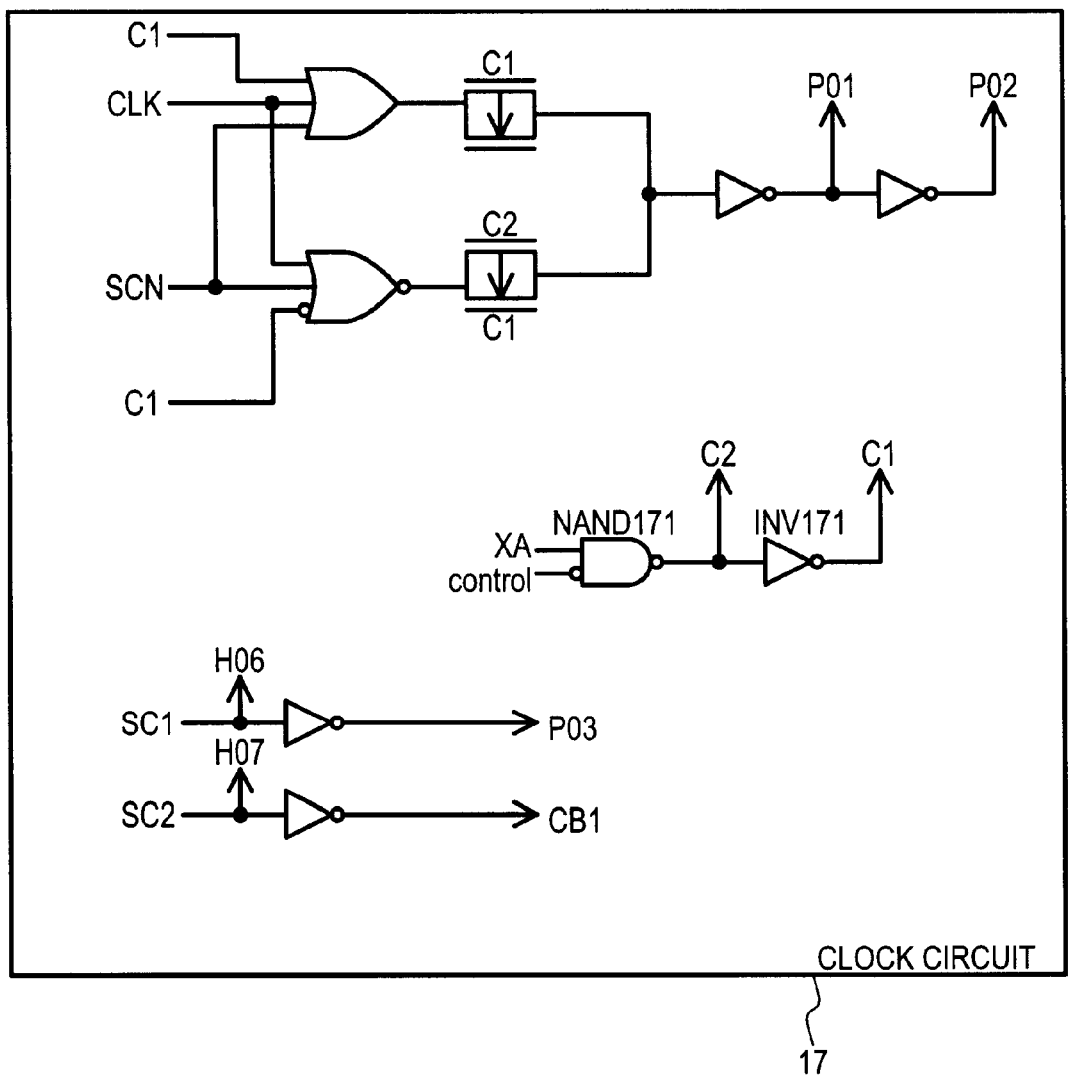
FIG. 3 is a circuit schematic diagram of a clock circuit of a scan flip-flop according to a fifth embodiment.
Figure 4:
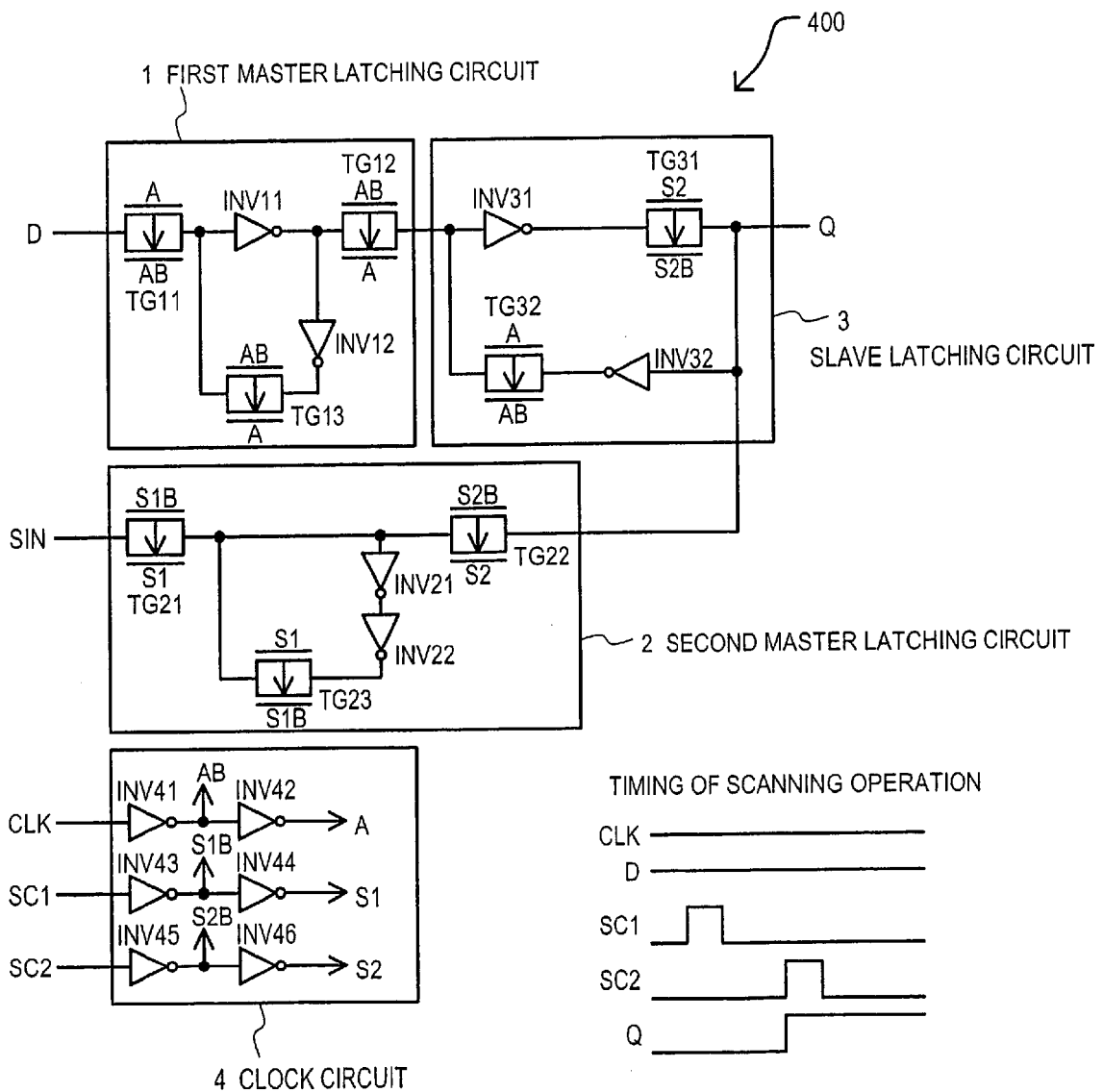
FIG. 4 is a circuit schematic diagram of a conventional scan flip-flop.
Figure 5:
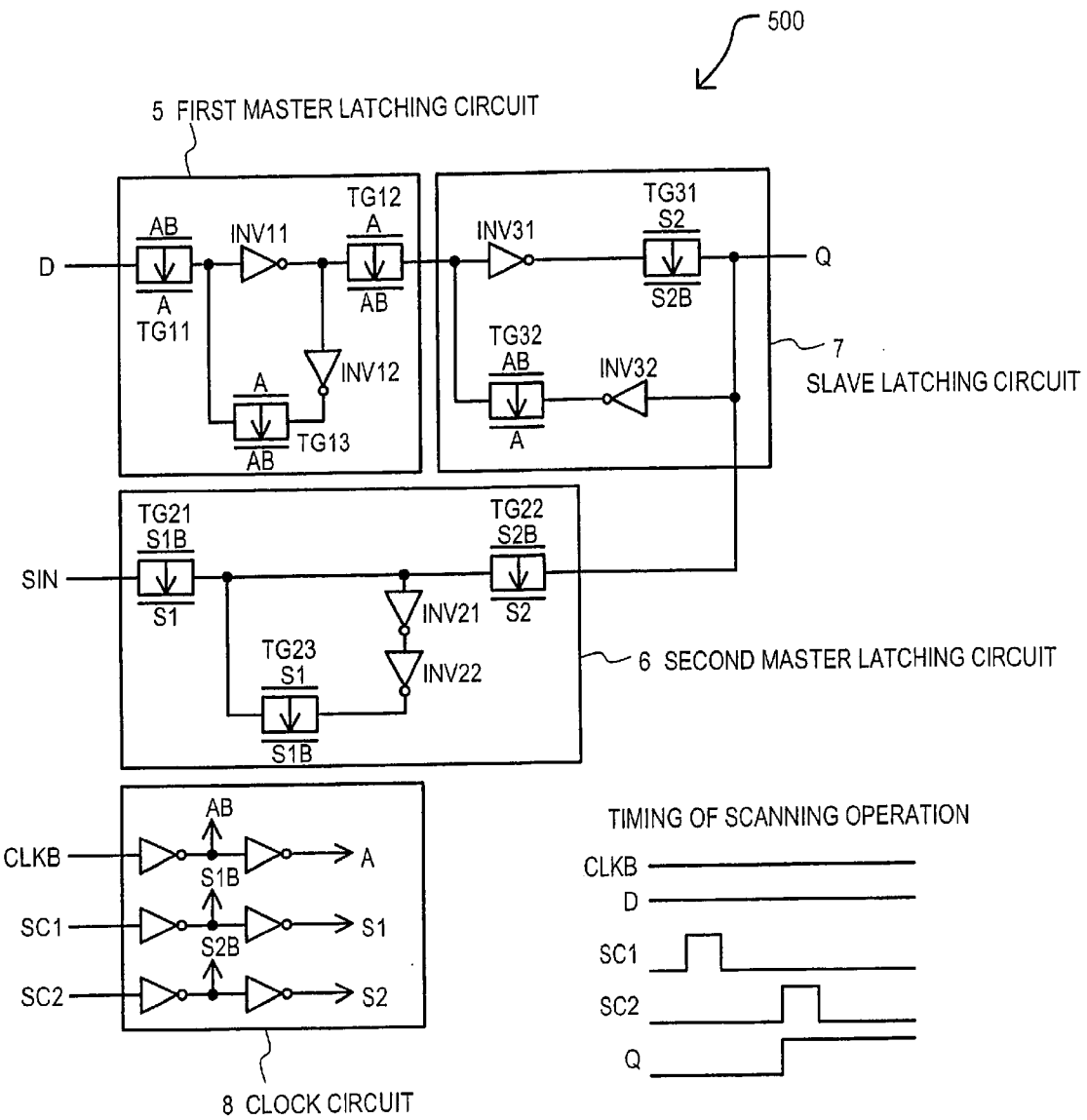
FIG. 5 is a circuit schematic diagram of a conventional scan flip-flop.
Figure 6:
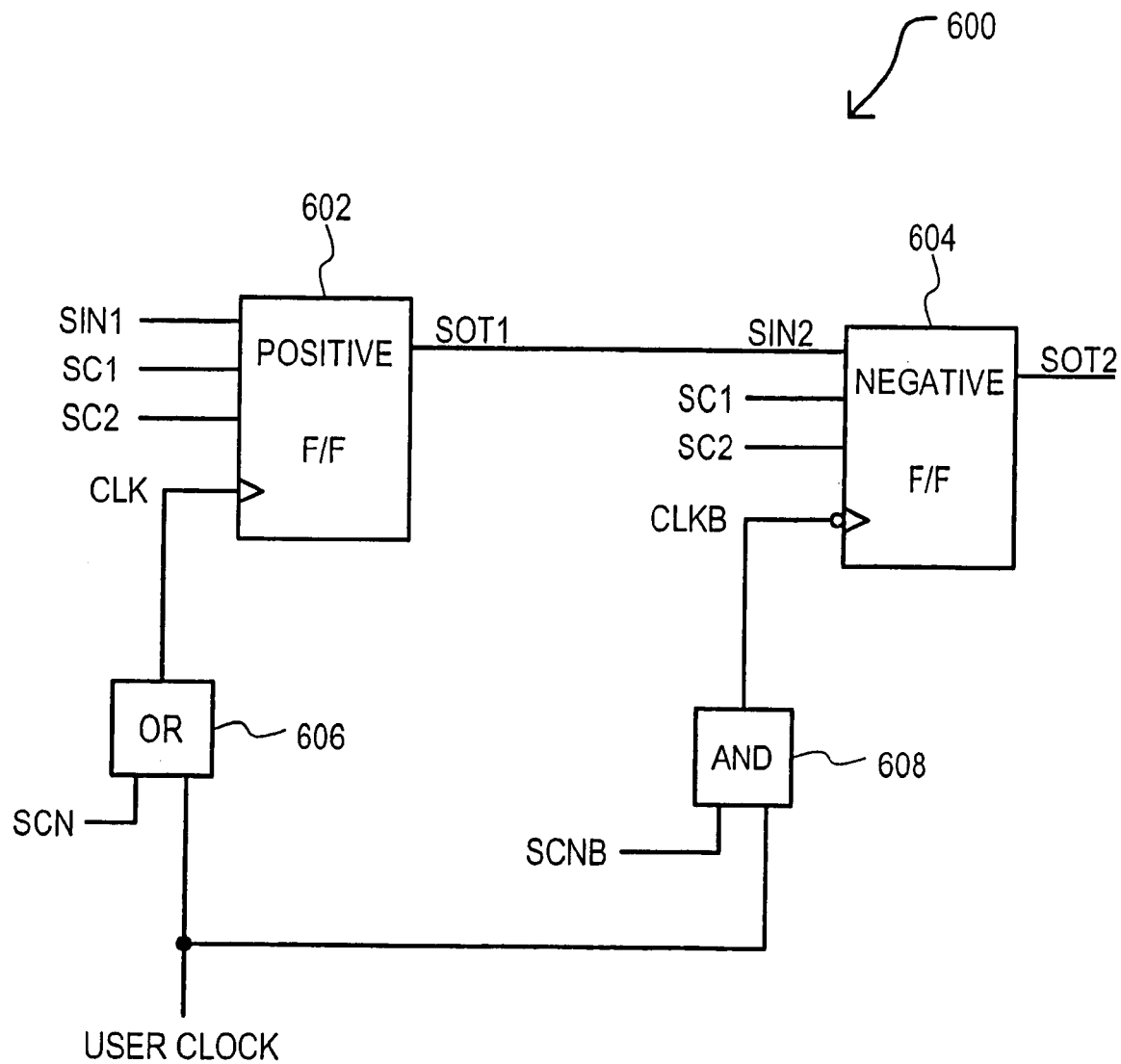
FIG. 6 is a block schematic diagram of a conventional semiconductor device including conventional scan flip-flops.

Referring now to FIG. 3, a circuit schematic diagram of a clock circuit of a scan flip-flop according to a fifth embodiment is set forth and given the general reference character 17.

Clock circuit 17 may be used to replace clock circuits (13A or 13B) or clock circuits (16A or 16B) of scan flip-flops (100A or 100B) or scan flip-flop (200A or 200B), respectively.

Clock circuit 17 may differ from clock circuits (13, 13B, 16A and 16B) in that signals (C2 and C1) may be generated by using a NAND gate NAND171 and inverter INV171. NAND gate NAND171 may receive signal XA at one input and control signal control at an inverted input and may provide signal C2 at an output. Inverter INV171 may receive signal C2 at an input and may provide signal C1 at an output.

Clock circuit 17 operates in essentially the same manner as clock circuit 13A in scan flip-flop 100A. In this way, a scan flip-flop including clock circuit 17 may reduce logic gates in clock lines which may be required in a conventional approach. In this way, a scan test may be performed with reduced clock skew adjustments.

It is understood that the embodiments described above are exemplary and the present invention should not be limited to those embodiments. Specific structures should not be limited to the described embodiments.

For example, OR gates provided in the clock circuit of the embodiments of FIGS. 1A, 2A, and 3 may be constructed to provide essentially equivalent logic using different logic circuits, such as AND/NAND gates and inverters, as just one example. Likewise, AND gates provided in the clock circuit of the embodiments of FIGS. 1B, 2B and 3 may be constructed to provide essentially equivalent logic using different logic circuits, such as OR/NOR gates and inverters. Also, NAND gates included in master latching circuits and slave latching circuits illustrated in FIGS. 1A, 1B, 2A, and 2B may be constructed to provide essentially equivalent logic using different logic gates, such as OR/NOR gates and inverters, as just one example.

The embodiments as described above may provide the following effects.

A scan flip-flop according to the embodiments may reduce or eliminate logic gates in clock lines. In this way, a scan test may be executed with reduced skew adjustments of clock lines, for example.

Also, by permitting a scan flip-flop to be set as a positive flip-flop by including a control signal may allow a scan test to be performed even if a positive/negative setting control signal is in an undetermined (unidentified) state. In this way, a scan test may be more reliably performed, for example, during a manufacturing stage or the like of a semiconductor integrated circuit device.

Additionally, power consumption in a normal operation may be reduced by disabling logic gates even though switching of the logic gates may not affect operation in a selected mode. For example, when a master latching circuit and a slave latching circuit are set in a positive flip-flop mode, a clock control circuit to control a negative flip-flop mode may be disabled and prevented from switching. Likewise, when a master latching circuit and a slave latching circuit are set in a negative flip-flop mode, a clock control circuit to control a positive flip-flop mode may be disabled and prevented from switching.

According to a semiconductor integrated circuit of the embodiments, logic gate in series with a clock signal (in a clock line) may be reduced or eliminated as compared to a conventional scan flip-flop. In this way, a scan test may be executed with reduced skew adjustments of clock lines, for example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A scan flip-flop having a normal operation and a scan test operation, the scan flip-flop comprising:
   a master latching circuit that latches a data input in response to a normal clock in the normal operation and latches a scan-in signal in response to a first scan clock in the scan test operation;
   a slave latching circuit that provides the latched data input from the master latching circuit in synchronism with the normal clock in the normal operation and provides the latched scan-in signal from the master latching circuit in synchronism with a second scan clock in the scan test operation; and
   a clock circuit coupled to receive a first switching signal that sets the master latching circuit and slave latching circuit to operate as a positive flip-flop or a negative flip-flop in the normal operation.

2. The scan flip-flop according to claim 1, wherein:
   the clock circuit is coupled to receive a control signal that enables the setting between the positive flip-flop and negative flip-flop operations in accordance with the first switching signal.

3. The scan flip-flop according to claim 1, wherein:
   the clock circuit is coupled to receive an operation selection signal that selects between the normal operation and the scan test operation.

4. The scan flip-flop according to claim 1, wherein:
   the master latching circuit includes a first latch that latches the data input in response to the normal clock in the normal operation and latches the scan-in signal in response to the first scan clock in the scan test operation.

5. The scan flip-flop according to claim 1, wherein:
the slave latching circuit provides the latched data input from the master latching circuit at a data output terminal and provides the latched scan-in signal from the master latching circuit at a scan output terminal.

6. The scan flip-flop according to claim 1, wherein:
the master latching circuit latches the data input in response to a rising edge of the normal clock when operating as a positive flip-flop; and
the master latching circuit latches the data input in response to a falling edge of the normal clock when operating as a negative flip-flop.

7. The scan flip-flop according to claim 1, wherein:
the slave latching circuit latches the data input in response to the normal clock when a subsequent data input is being loaded in the master latching circuit.

8. A scan flip-flop having a normal operation for operating as a normal flip-flop receiving data input and a scan test operation for operating as a flip-flop receiving a scan-in signal as a test pattern signal and a first and second scan clock as test clocks, the scan flip-flop including:
a master latching circuit that temporarily holds the data input in response to a normal clock in the normal operation and that temporarily holds the scan-in signal in response to the first scan clock in the scan test operation;
a slave latching circuit that outputs the temporarily held data input in the master latching circuit in response to the normal clock in the normal operation and outputs the temporarily held scan-in signal in the master latching circuit in response to the second scan clock in the scan test operation; and
a clock circuit coupled to receive an externally applied first switching signal that configures the master latching circuit and slave latching circuit into a positive flip-flop that outputs the temporarily held data input in response to a rising edge of the normal clock or a negative flip-flop that outputs the temporarily held data input in response to a falling edge of the normal clock, the clock circuit also being coupled to receive an externally applied second switching signal that switches the master latching circuit and slave latching circuit into the normal operation or the scan test operation.

9. The scan flip-flop according to claim 8, wherein:
the clock circuit is coupled to receive an externally applied third switching signal that configures the master latching circuit and slave latching circuit into a positive flip-flop irrespectively of a value of the first switching signal.

10. The scan flip-flop according to claim 8, further wherein:
the master latching circuit includes
a first gate circuit having a first gate input and providing a first gate output;
a first transfer gate disposed between the data input and the first gate input, the first transfer gate inhibits or allows loading of the data input into the master latching circuit in response to the normal clock;
a second transfer gate disposed between the scan-in signal and the first gate input, the second transfer gate inhibits or allows loading of the scan-in signal into the master latching circuit in response to the first-scan clock;
a second gate circuit coupled to receive the first gate output at a second gate input and provide a second gate output;
a third transfer gate disposed between the second gate output and the first gate input to form a first latch including the first and second gate circuits and the third transfer gate;
the slave latching circuit includes
a third gate circuit having a third gate input and providing a third gate output;
a fourth transfer gate disposed between an output of the master latching circuit and the third gate input, the fourth transfer gate inhibits or allows loading of the output of the master latching circuit into the slave latching circuit in response to the normal clock;
a fourth gate circuit coupled to receive the third gate output at a fourth gate input and provide a fourth gate output; and
a fifth transfer gate coupled between the fourth gate output and the third gate input to form a second latch including the third gate circuit, the fourth gate circuit and the fifth transfer gate.

11. The scan flip-flop according to claim 10, wherein:
the clock circuit sets the master latching circuit and slave latching circuit as the positive flip-flop or the negative flip-flop by controlling the first transfer gate, second transfer gate, third transfer gate, and fourth transfer gate.

12. The scan flip-flop according to claim 8, wherein:
the clock circuit includes
a first logic gate coupled to receive the second switching signal, the normal clock, and the first switching signal that generates a first control signal that sets the master latching circuit and slave latching circuit as the positive flip-flop in the normal operation; and
a second logic gate coupled to receive the second switching signal, the normal clock, and the first switching signal that generates the first control signal that sets the master latching circuit and slave latching circuit as the negative flip-flop in the normal operation wherein
an output of the first logic gate is fixed to a predetermined logic value by the first switching signal when the master latching circuit and slave latching circuit are collectively set as the negative flip-flop and an output of the second logic gate is fixed to a predetermined logic value by the first switching signal when the master latching circuit and slave latching circuit are collectively set as the positive flip-flop.

13. The scan flip-flop according to claim 8, wherein:
the clock circuit is coupled to receive an externally applied third switching signal that sets the master latching circuit and slave latching circuit as the positive flip-flop irrespectively of the value of the first switching signal.

14. The scan flip-flop according to claim 8, wherein:
the slave latching circuit outputs the temporarily held data input in the master latching circuit in response to a rising edge of the normal clock when the master latching circuit and slave latching circuit operate as a positive flip-flop; and
the slave latching circuit outputs the temporarily held data input in the master latching circuit in response to a falling edge of the normal clock, when the master latching circuit and slave latching circuit operate as a negative flip-flop.

15. A semiconductor integrated circuit, comprising:
a scan flip-flop having a normal mode and a scan test mode, the scan flip-flop coupled to receive a normal data input, a scan data input, and a first clock signal and providing a normal data output and a scan data output;

a clock circuit coupled to receive a normal clock signal, a first control signal, and a scan test signal and providing the first clock signal;

the first control signal having a positive flip-flop logic level and a negative flip-flop logic level; and the scan test signal having a scan test mode logic level and a normal mode logic level wherein the scan flip-flop operates as a positive flip-flop when the first control signal has the positive flip-flop logic level and the scan test signal has the normal mode logic level and operates as a negative flip-flop when the first control signal has the negative flip-flop logic level and the scan test signal has the normal mode logic level.

16. The semiconductor integrated circuit, according to claim 15, wherein:

the scan flip-flop includes a master latch coupled to receive the normal data input and the scan data input and providing a master latch output; and a slave latch coupled to receive the master latch output and providing the normal data output and the scan data output.

17. The semiconductor integrated circuit according to claim 15, wherein:

the first clock signal has an inverse logic relationship with respect to the normal clock signal when the scan flip-flop operates as a negative flip-flop and a non-inverse logic relationship with respect to the normal clock signal when the scan flip-flop operates as a positive flip-flop.

18. The semiconductor integrated circuit according to claim 17, wherein:

the clock circuit provides a second clock signal to the scan flip-flop; and the first and second clock signals are complementary.

19. The semiconductor integrated circuit according to claim 15, wherein:

the clock circuit is coupled to receive a second control signal having a first logic level and a second logic level; and the scan flip-flop is set as a positive flip-flop irrespective of the first control signal when the second control signal has the first logic level.

20. The semiconductor integrated circuit according to claim 15, wherein:

the scan flip-flop is coupled to receive a first scan clock and a second scan clock and, when in the scan test mode, scan data input is loaded into the scan flip-flop in response to the first scan clock and scan data output is provided in response to the second scan clock.

* * * * *